(12) United States Patent
Smith et al.

(10) Patent No.: US 6,333,680 B1
(45) Date of Patent: Dec. 25, 2001

(54) METHOD AND SYSTEM FOR CHARACTERIZING COUPLING CAPACITANCE BETWEEN INTEGRATED CIRCUIT INTERCONNECTS

(75) Inventors: Howard H. Smith, Beacon; Alina Deutsch, Chappaqua; Ching-Lung L. Tong, Fishkill; Rolf H. Nijhuis, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/677,348

(22) Filed: Oct. 2, 2000

(51) Int. Cl.[7] ............... H03B 5/24; H03K 3/02; G01R 27/26
(52) U.S. Cl. ............... 331/57; 331/46; 331/143; 324/658; 324/676; 324/681
(58) Field of Search ................ 331/46, 57, 74, 331/111, 143, DIG. 3; 324/658, 676, 678, 681, 687, 688; 377/19, 24

(56) References Cited

U.S. PATENT DOCUMENTS

| | | |
|---|---|---|
| 4,795,964 | 1/1989 | Mahant-Shetti et al. . |
| 5,696,451 * | 12/1997 | Keirn et al. ............ 324/687 |
| 5,963,043 | 10/1999 | Nassif . |
| 6,028,989 | 2/2000 | Dansky et al. . |

\* cited by examiner

*Primary Examiner*—David Mis
(74) *Attorney, Agent, or Firm*—Lynn Augspurger; Cantor Colburn LLP

(57) ABSTRACT

An exemplary embodiment of the invention is a method of characterizing capacitances of a plurality of integrated circuit interconnects. The method includes coupling a first oscillator to a first integrated circuit interconnect and coupling a second oscillator to a second integrated circuit interconnect. The first oscillator is activated to characterize the sum of (i) coupling capacitance between the first integrated-circuit interconnect and the second integrated-circuit interconnect and (ii) ground capacitance between the first integrated-circuit interconnect and a ground. In addition, both of the first oscillator and the second oscillator are activated to characterize the ground capacitance between the first integrated-circuit interconnect and the ground.

18 Claims, 3 Drawing Sheets

$C_{NET} = C_{10} + C_{12}$    $C_{NET} = C_{10}$

METHOD AND SYSTEM FOR CHARACTERIZING COUPLING CAPACITANCE BETWEEN INTEGRATED CIRCUIT INTERCONNECTS

BACKGROUND OF THE INVENTION

The invention relates to a method and system for characterizing coupling capacitance between integrated circuit interconnects. The problem of characterizing on-chip wiring parameters such as per unit length capacitance and resistance associated with back end of the line(BEOL) chip technology has been in the inability to quantify process variations across the chip and/or wafer. With increased focus on fine line technology, wire to wire coupling capacitance characterization is important in BEOL process development and manufacturing.

Current measurement techniques applied to measure the capacitance and resistance are either passive or active in nature. Passive measurement techniques can characterize coupling capacitance as well as total capacitance and resistance. Unfortunately, accurate passive measurements are cumbersome due to the fact that the measuring structure has to be large to obtain accuracy in the measurement procedure and are used in limited applications for manufacturing level testing. Active techniques such as recirculating ring oscillators (RLF) can easily be applied during manufacturing testing but are limited in scope as to the information that can be derived with respect to the capacitance of the structure.

BRIEF SUMMARY OF THE INVENTION

An exemplary embodiment of the invention is a method of characterizing capacitances of a plurality of integrated circuit interconnects. The method includes coupling a first oscillator to a first integrated circuit interconnect and coupling a second oscillator to a second integrated circuit interconnect. The first oscillator is activated to characterize the sum of (i) coupling capacitance between the first integrated-circuit interconnect and the second integrated-circuit interconnect and (ii) ground capacitance between the first integrated-circuit interconnect and a ground. In addition, both of the first oscillator and the second oscillator are activated to characterize the ground capacitance between the first integrated-circuit interconnect and the ground.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1A:
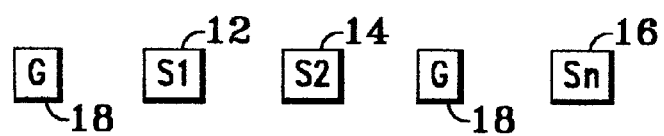
FIG. 1A is a cross sectional view of interconnects within an integrated circuit.

FIG. 1A is a cross sectional view of interconnects within an integrated circuit. As shown in FIG. 1A, the interconnects include signal interconnects 12, 14 and 16 positioned adjacent to ground interconnects 18 and 20. It is understood that the arrangement of the interconnects is exemplary. For example, the ground interconnects may be replaced with ground plane as is known in the art. The interconnects shown in FIG. 1A may correspond to back-end-of-line (BEOL) interconnects, an industry term for the final stage of interconnect wiring.

Figure 1B:
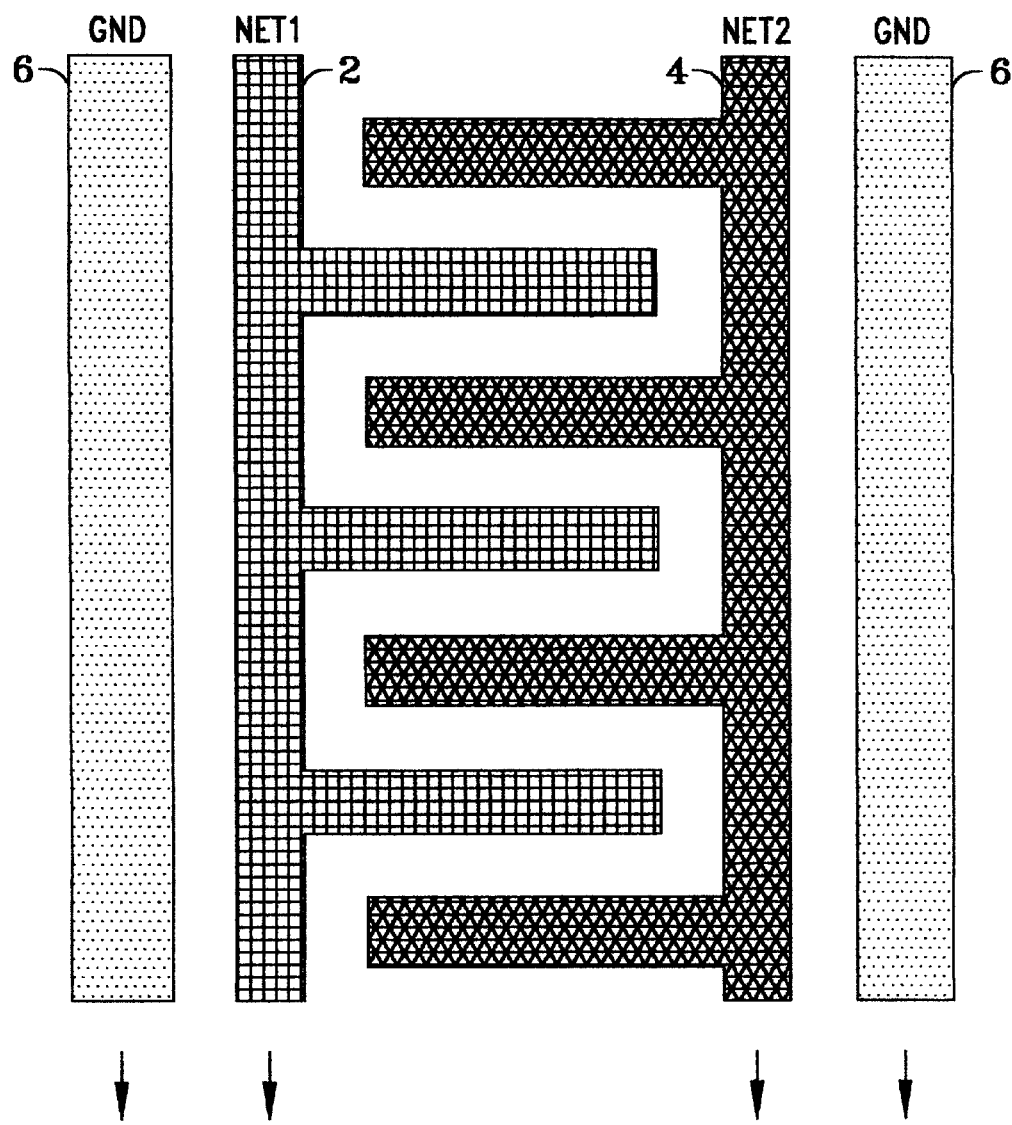
FIG. 1B is a top view of alternate interconnects within an integrated circuit.

FIG. 1B is a top view of alternate interconnects within an integrated circuit. The interconnects include signal interconnects 2 and 4 and ground interconnects 6. The signal interconnects 2 and 4 include a plurality of extensions for inducing capacitance between the signal interconnects 2 and 4 which is sometimes desirable (e.g., counteracting crosstalk).

Figure 2:
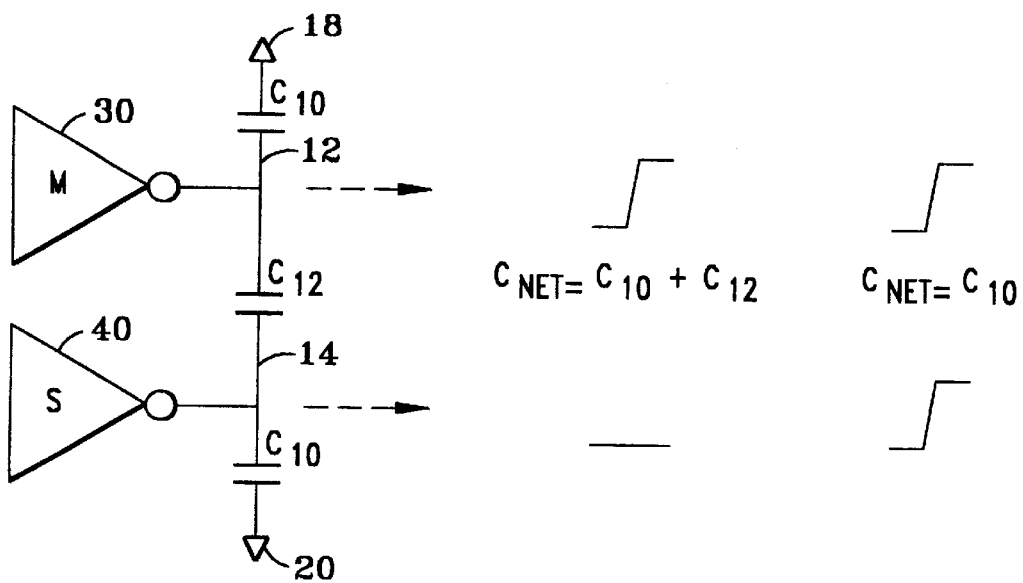
FIG. 2 is a schematic diagram of circuitry for characterizing capacitance between interconnects within an integrated circuit.

A number of capacitances exist between the interconnects as shown in FIG. 2. FIG. 2 illustrates a capacitance C10 between signal interconnect 12 and ground interconnect 18 and a similar capacitance C10 between signal interconnect 14 and ground interconnect 20. Also present is a coupling capacitance C12 between signal interconnect 12 and signal interconnect 14. In order to test the various capacitances, a master oscillator 30 is connected to signal interconnect 12 and a slave oscillator is connected to signal interconnect 14. In an exemplary embodiment, the master oscillator 30 and the slave oscillator 40 are implemented using recirculating ring oscillators (RLF's). As is known in the art, such oscillators typically employ an odd number of gates (e.g., inverters, AND gates) in series, with the last gate providing an input to the first gate. This creates a change of state with the oscillation frequency being dependent on gate delay and the number of gates.

When a ring oscillator is externally loaded with a lumped capacitance, the oscillation period of the ring-oscillator exhibits a nearly linear relationship with the lumped capacitance. Thus, the amount of capacitance present can be detected based on the detected oscillation frequency of the oscillator.

To test the coupling capacitance C12 between signal interconnect 12 and signal interconnect 14, the master oscillator 30 and slave oscillator 40 are operated in a specific order. Initially, only the master oscillator 30 is active and the slave oscillator 40 is inactive. In this mode, the capacitance present on the master oscillator is C10+C12. The oscillation frequency of the signal on signal interconnect 12 is detected (e.g., through a test point) to characterize the capacitance C10+C12.

Figure 3:
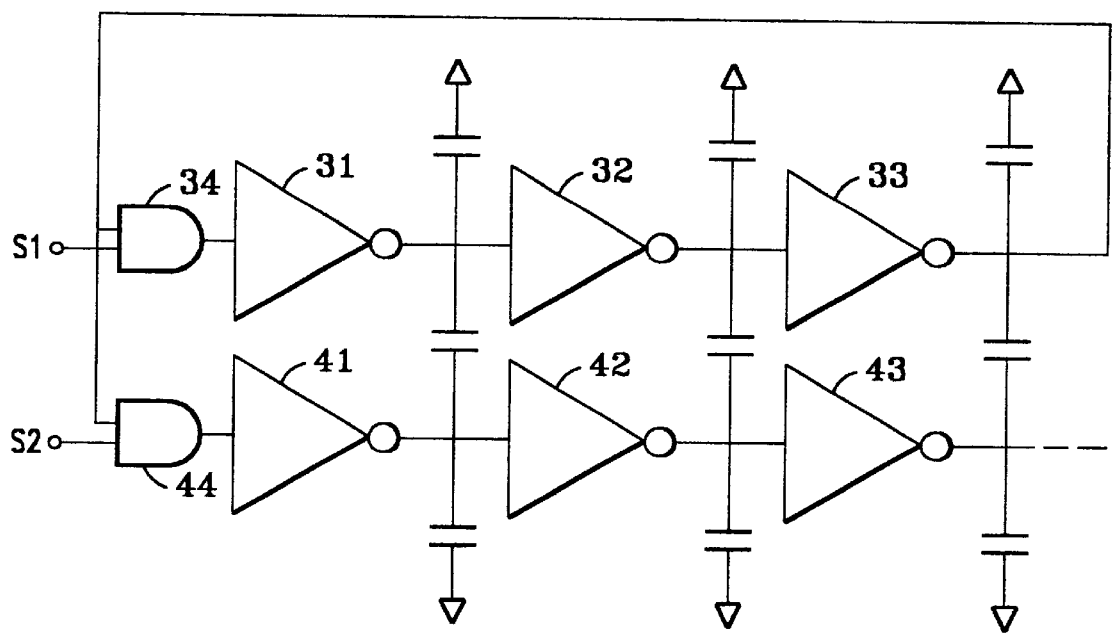
FIG. 3 is a schematic diagram of circuitry for characterizing capacitance between interconnects within an integrated circuit in an alternate embodiment of the invention.

The slave oscillator 40 is controlled through a common feedback path with the master oscillator 30 as described in further detail herein with reference to FIG. 3. Thus, a predetermined time after the master oscillator 30 has been active, the slave oscillator will be activated. With both the master and slave oscillators active, the capacitance C12 is effectively canceled due to the similar potential on each side of capacitance C12. Capacitance C10 between signal interconnect 14 and ground interconnect 20 also does not affect signal interconnect 12. Thus, the oscillation frequency on signal interconnect 12 is detected and is characteristic of the capacitance C10 between signal interconnect 12 and ground interconnect 18. The coupling capacitance C12 can then be characterized based on the values of C10+C12 and C10.

FIG. 3 depicts an extension of the embodiment shown in FIG. 2. FIG. 3 depicts a master oscillator implemented through inverters 31, 32 and 33 coupled in series with the output of inverter 33 providing an input to inverter 30 and an input to inverter 41. The slave oscillator includes inverters 41, 42 and 43. In the example shown in FIG. 3, the slave oscillator is open ended and is responsive to the feedback of the master oscillator. This configuration allows for the testing of capacitance along an extended length of a signal interconnects. AND gates 34 and 44 are used to control feedback to the master oscillator and slave oscillator though select bits S1 and S2. If S1=0 and S2=0, then neither the master oscillator nor the slave oscillator operates. If S1=0 and S2=1, then neither the master oscillator nor the slave oscillator operates, unless the slave oscillator is fedback on itself in which case the salve oscillator will run. If S1=1 and S2=0, then only the master oscillator will run. If S1=1 and S2=1, then both the master and slave oscillator will run.

Figure 4:
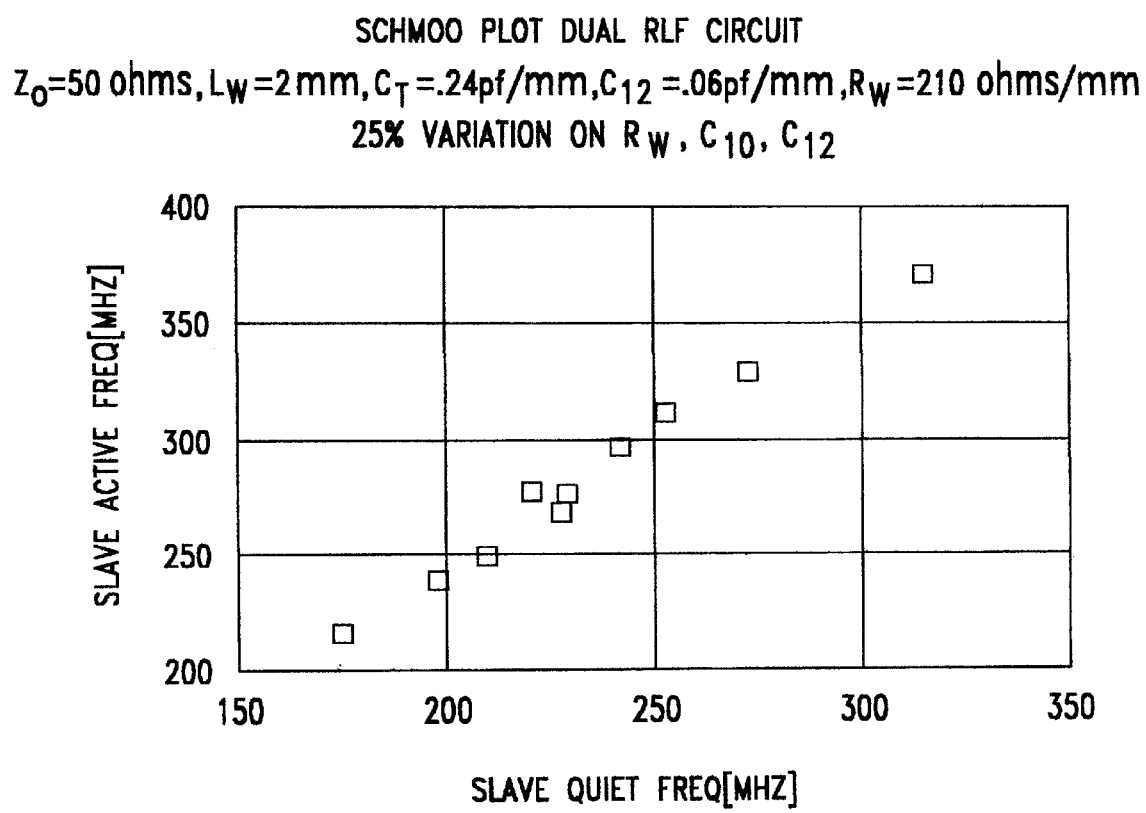
FIG. 4 is graph of slave active frequency versus slave inactive frequency.

The testing method and system may be used to test integrated circuits for the proper level of coupling capacitance. For example, data from known good integrated circuits can be used to generated a plot of the frequency of oscillation of the master oscillator when the slave oscillator is enabled versus when the slave oscillator is disabled. FIG. 4 depicts such a plot. As shown in FIG. 4, when the slave is disabled, the frequency of the master oscillator is approximately 50 MHZ slower than when the slave is enabled. This is expected given that less capacitance is effecting the master oscillator when the slave is enabled. The performance of integrated circuits can be compared to frequency results for known good integrated circuits to detect excessive capacitance and possible process flaws.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of characterizing capacitances of a plurality of integrated circuit interconnects, said method comprising:

coupling a first oscillator to a first integrated circuit interconnect;

coupling a second oscillator to a second integrated circuit interconnect;

activating said first oscillator to characterize the sun of (i) coupling capacitance between said first integrated-circuit interconnect and said second integrated-circuit interconnect and (ii) ground capacitance between said first integrated-circuit interconnect and a ground; and, activating both of said first oscillator and said second oscillator to characterize said ground capacitance between said first integrated-circuit interconnect and said ground.

2. The method of claim 1 wherein said ground is a ground plane.

3. The method of claim 1 wherein said ground is a ground interconnect.

4. The method of claim 1 wherein said first integrated circuit interconnect is a BEOL interconnect.

5. The method of claim 1 wherein said second integrated circuit interconnect is a BEOL interconnect.

6. The method of claim 1 wherein said first oscillator is a first ring oscillator.

7. The method of claim 6 wherein said first ring oscillator includes a plurality of gates connected in series, an output of a last gate providing an input to a first gate.

8. The method of claim 7 wherein said second oscillator is a second ring oscillator.

9. The method of claim 8 wherein said second ring oscillator includes a plurality of gates connected in series, wherein said output of said last gate of said first oscillator providing an input to said second oscillator.

10. A system for characterizing capacitances of a plurality of integrated circuit interconnects, said system comprising:

a first oscillator coupled to a first integrated circuit interconnect;

a second oscillator coupled to a second integrated circuit interconnect;

wherein said first oscillator is activated to characterize the sum of (i) coupling capacitance between said first integrated-circuit interconnect and said second integrated-circuit interconnect and (ii) ground capacitance between said first integrated-circuit interconnect and a ground; and, wherein both of said first oscillator and said second oscillator are activated to characterize said ground capacitance between said first integrated-circuit interconnect and said ground.

11. The system of claim 10 wherein said ground is a ground plane.

12. The system of claim 10 wherein said ground is a ground interconnect.

13. The system of claim 10 wherein said first integrated circuit interconnect is a BEOL interconnect.

14. The system of claim 10 wherein said second integrated circuit interconnect is a BEOL interconnect.

15. The system of claim 10 wherein said first oscillator is a first ring oscillator.

16. The system of claim 15 wherein said first ring oscillator includes a plurality of gates connected in series, an output of a last gate providing an input to a first gate.

17. The system of claim 16 wherein said second oscillator is a second ring oscillator.

18. The system of claim 17 wherein said second ring oscillator includes a plurality of gates connected in series, wherein said output of said last gate of said first oscillator providing an input to said second oscillator.

* * * * *

UNITED STATES PATENT AND TRADEMARK OFFICE
CERTIFICATE OF CORRECTION

PATENT NO. : 6,333,680 B1
DATED : December 25, 2001
INVENTOR(S) : Howard H. Smith et al.

It is certified that error appears in the above-identified patent and that said Letters Patent is hereby corrected as shown below:

<u>Column 3,</u>
Line 42, after "characterize the" delete "sun" and insert therefor -- sum --

Signed and Sealed this

Fifth Day of April, 2005

JON W. DUDAS
*Director of the United States Patent and Trademark Office*